(12) United States Patent
Chen et al.

(10) Patent No.: US 11,397,836 B2
(45) Date of Patent: Jul. 26, 2022

(54) QUANTIFYING POWER USAGE FOR A SERVICE

(71) Applicant: Hewlett Packard Enterprise Development LP, Houston, TX (US)

(72) Inventors: Yuan Chen, Sunnyvale, CA (US); Dejan S Milojicic, Palo Alto, CA (US); Daniel Juergen Gmach, Palo Alto, CA (US); Cullen E. Bash, Los Gatos, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 707 days.

(21) Appl. No.: 16/185,291

(22) Filed: Nov. 9, 2018

(65) Prior Publication Data
US 2019/0080028 A1    Mar. 14, 2019

Related U.S. Application Data

(63) Continuation of application No. 14/349,156, filed as application No. PCT/US2011/056491 on Oct. 15, 2011, now Pat. No. 10,366,176.

(51) Int. Cl.
*G06F 30/00* (2020.01)
*G06Q 10/00* (2012.01)

(52) U.S. Cl.
CPC ............ *G06F 30/00* (2020.01); *G06Q 10/00* (2013.01)

(58) Field of Classification Search
None
See application file for complete search history.

(56) References Cited

U.S. PATENT DOCUMENTS

| | | |
|---|---|---|
| 2004/0010600 A1 | 1/2004 | Baldwin et al. |
| 2004/0039728 A1 | 2/2004 | Fenlon et al. |
| 2005/0209833 A1 | 9/2005 | Bishop et al. |
| 2009/0138305 A1 | 5/2009 | Shan et al. |
| 2009/0201293 A1 | 8/2009 | Tung et al. |
| 2009/0234512 A1 | 9/2009 | Ewing et al. |
| 2010/0049494 A1 | 2/2010 | Radibratovic et al. |
| 2010/0106436 A1 | 4/2010 | Ichinomiya et al. |
| 2010/0145629 A1 | 6/2010 | Botch et al. |
| 2010/0180275 A1* | 7/2010 | Neogi ............... G06F 1/3203 718/1 |
| 2010/0191998 A1 | 7/2010 | Moore |

(Continued)

FOREIGN PATENT DOCUMENTS

| | | |
|---|---|---|
| EP | 2244216 A1 | 10/2020 |
| JP | 20070323570 | 12/2007 |

OTHER PUBLICATIONS

Ripal Nathuji et al., "Exploiting Platform Heterogeneity for Power Efficient Data Centers," 2007, IEEE Fourth International Conference on Autonomic Computing, 10 pages.

(Continued)

*Primary Examiner* — Kamini S Shah
*Assistant Examiner* — Russ Guill
(74) *Attorney, Agent, or Firm* — Jaffery Watson Mendonsa & Hamilton

(57) ABSTRACT

Quantifying power usage for a service. An example method may include identifying a dependency model for the service, the dependency model based in part on infrastructure providing the service. The method may also include determining power usage for the service using the dependency model.

20 Claims, 7 Drawing Sheets

(56) References Cited

U.S. PATENT DOCUMENTS

| | | | |
|---|---|---|---|
| 2010/0274602 A1 | 10/2010 | Kaufman et al. | |
| 2011/0016342 A1 | 1/2011 | Rpwam et al. | |
| 2011/0077795 A1 | 3/2011 | VanGilder et al. | |
| 2011/0082820 A1 | 4/2011 | Shah et al. | |
| 2011/0178938 A1 | 7/2011 | Reich-Weiser | |
| 2011/0208622 A1 | 8/2011 | Gopisetty et al. | |
| 2011/0225276 A1 | 9/2011 | Hamilton et al. | |
| 2011/0231836 A1 | 9/2011 | Wookey | |
| 2011/0258619 A1 | 10/2011 | Wookey | |
| 2013/0132009 A1* | 5/2013 | Rolia .................... | G06F 1/3209 702/61 |

OTHER PUBLICATIONS

Retail Info Systems "Microsoft Releases New Environmental Sustainability Dashboard", (web page), available online at <https://risnews.com/microsoft-releases-new-environmental-sustainability-dashboard>, Feb. 24, 2009, 6 pages.

Li Qi et al., "Service dependency model for dynamic and stateful grid services," 2007, in International Conference on Algorithms and Architectures for Parallel Processing 2007, LNCS 4494, Springer-Verlag, pp. 278-289.

Dave Ohara, "CA about to launch EcoSoftware for Green IT", Oct. 21, 2009, 2 pages.

Alexandre Mello Ferreira, "Energy-Aware Design of Service-Based Applications," 2009, ICSOC-ServiceWave 2009, LNCS 5900, Springer-Verlag, pp. 99-114.

"VMware Infrastructure Architecture Overview," 2006, VMware, 14 pages.

"IBM Launches "Ready for IBM Energy & Environment" Validation for Business Partners", (web page), available online at <https://www-03.ibm.com/press/us/en/pressrelease/26604.wss>, Feb. 5, 2009, 2 pages.

"CA Configuration Automation," 2010, CA, 4 pages.

Anton Beloglazov el al, Energy-Aware Resource Allocation Heuristics For Efficient Management Of Data Centers For Cloud Computing, Online May 4, 2011, Future Generation Computing Systems, vol. 28, Issue 5, pp. 755-768.

International Search Report, PCT/US2011/056491, dated Apr. 10, 2012, 10 pages.

Joe Francoeur, "Algorithms Using Java For Spreadsheet Dependent Cell Recomputation," 2008, The MITRE Corporation, pp. 1-24.

Peoples, C. et al., "Energy-aware Data Centre Management" Jan. 28-30, 2011.

Shekhar Srikantaiah et al., Energy Aware Consolidation For Cloud Computing, 2008, USENIX HotPower'08, Workshop on Power Aware Computing and Systems at OSDI, pp. 1-5.

Tada, Harumasa et al., Evaluation Of Effect Of Network Energy Consumption In Load Distribution Across Data Centers, International Conference on Broadband Communications, Networks and Systems, Springer Berlin Heidelberg, 2010, 17 Pgs.

* cited by examiner

Fig. 4

| Services | Economic (cost per M transactions) | | | | Ecological (per hour) | | | |
|---|---|---|---|---|---|---|---|---|
| | IT | cooling | UPS | support | econo. overall | $CO_2$ (kg) | water (Gal) | Resource Use (MJ-eq) | ecolog. overall |
| Service 1 | $0.72 | $0.35 | $0.16 | $0.43 | | 0.6 | 2.6 | 8.3 | |
| Service 2 | $1.27 | $0.80 | $0.21 | $1.11 | | 0.65 | 3.3 | 9.6 | |
| Service 3 | $1.05 | $0.47 | $0.12 | $1.07 | | 0.59 | 2.3 | 8.1 | |
| Service 4 | $0.27 | $0.13 | $0.05 | $0.09 | | 0.43 | 2.4 | 5.9 | |
| Service 5 | $1.82 | $0.77 | $0.11 | $1.17 | | 1.02 | 4.3 | 14.2 | |
| Service 6 | $1.23 | $0.84 | $0.11 | $0.98 | | 1.50 | 4.4 | 19.2 | |
| Service 7 | $0.85 | $0.26 | $0.10 | $0.16 | | 0.66 | 2.6 | 9.6 | |
| Service 8 | $1.04 | $0.24 | $0.10 | $0.93 | | 0.63 | 2.5 | 7.4 | |

US 11,397,836 B2

QUANTIFYING POWER USAGE FOR A SERVICE

CROSS REFERENCE TO RELATED APPLICATION

This application is a continuation of U.S. National Stage application Ser. No. 14/349,156 filed on Apr. 2, 2014, which claims priority to International Application No. PCT/US2011/056491 filed on Oct. 15, 2011. The contents of which are incorporated herein by reference in its entirety.

BACKGROUND

Consumers are increasingly aware of sustainability issues, putting pressure on manufacturers to deliver products that have a lesser impact on the environment. Sustainability issues at the forefront of consumer awareness include, but are not limited to, carbon emissions, recycling, energy consumption, and water use. Sustainability is also an increasing concern for service providers, as demand for services increase alongside rising energy costs, regulatory requirements, and social concerns over greenhouse gas emissions. In order to reduce the environmental impact, service providers have to understand what is being consumed to provide their services, and in turn, what impact this consumption has on the environment. Currently, there are no solutions for analyzing the environmental impact of a service.

Recently, computer software tools have been developed for studying sustainability efforts at the infrastructure-level. These computer tools are designed around compliance, assessment, energy metering for infrastructure (e.g., appliances and buildings). However, these efforts focus on a single aspect of the environmental impact (e.g., electricity usage).

Manual calculation with limited automation is still employed to determine partial costs for a business outcome. But these approaches rely on human intuition to adjust resource consumption to improve sustainability efforts. Accordingly, these approaches suffer from the high cost of human engagement, and are error-prone. In addition, there is little sharing of solutions between vendors, resulting in a lack of a comprehensive knowledge base for the many potential factors that affect sustainability decisions. This also makes it difficult to account for resources implemented on cross-data platforms, for example, those being provided by the so-called "cloud" computing environment.

BRIEF DESCRIPTION OF THE DRAWINGS

FIG. 4 shows example output for a sustainability dashboard.

DETAILED DESCRIPTION

Quantifying power consumption in the service-level space is inherently complex and depend on numerous factors that impact outcome. Compared to the relatively straightforward infrastructure-level assessment, assessing power consumption at the service-level is based on a comprehensive understanding and detailed knowledge of service topology, service dependency, and the relationship between service-level components and infrastructure.

The systems and methods disclosed herein aid in understanding, expressing, and assessing power consumption for services. In particular, the systems and methods may be implemented to help identify dependencies, and relate these dependencies to infrastructure, to provide a better understanding of power consumption at the service-level. The systems and methods may also provide representations and output (e.g., on a display or in a report format) of the power consumption for providing various services for evaluation and comparison. In an example, the systems and methods may be implemented as a service itself, to improve the understanding and management of service-level sustainability.

In an example, modeling is utilized to discover service-level power consumption of individual services executing in data center(s), including cross-platform data centers such as the cloud. In an example, the modeling acquires an awareness of the underlying infrastructure hosting the service and service dependencies, and then apportions power consumption to the service in question.

Consumers of services can use output from the determinations to help select a service and/or service provider based at least in part on their own power consumption preferences (e.g., economical, ecological, and/or social preferences). Service providers and their managers can also use output from the determinations as a competitive advantage, for example, if the service provider can show lower power consumption relative to their competition. Service providers and their managers can also use this information to develop pricing models that account for the power consumption of their services, including detailed metrics such as, but not limited to, energy consumption, carbon emissions, regulatory issues, and associated costs.

The systems and methods described herein provide a solution for service providers who want to have a better understanding of power consumption for providing a service. In an example, the systems and methods utilize resource information for data center(s), and service-level dependencies, to derive resource consumption attributable to a service. Information may be computed using models. Accordingly, the systems and methods may be used to determine the power consumption of individual services.

Before continuing, it is noted that as used herein, the terms "includes" and "including" mean, but is not limited to, "includes" or "including" and "includes at least" or "including at least." The term "based on" means "based on" and "based at least in part on."

Figure 1:
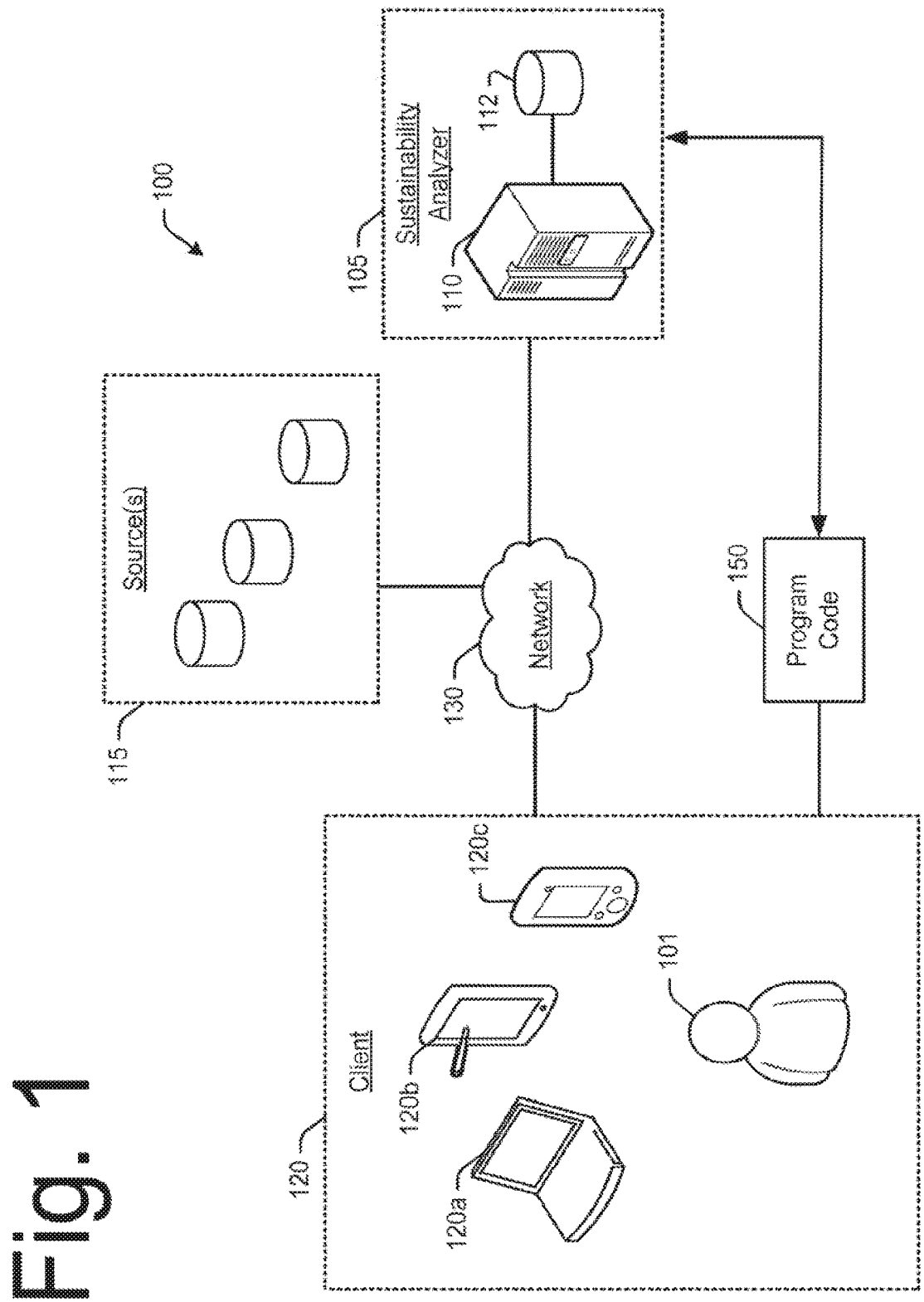
FIG. 1 is a high-level illustration of an example networked computer environment which may be implemented to quantify power usage for a service.

FIG. 1 is a high-level illustration of an example networked computer environment 10 which may be implemented to quantify power consumption for a service. Computer environment 100 may be implemented with any of a wide variety of computing devices, such as, but not limited to, stand-alone desktop/laptop/netbook computers, workstations, server computers, blade servers, mobile devices, and appliances (e.g., devices dedicated to providing a service), to name only a few examples. Each of the computing devices may include memory, storage, and a degree of data processing capability at least sufficient to manage a communications connection either directly with one another or indirectly (e.g., via a network). At least one of the computing devices is also configured with sufficient processing capability to execute the program code described herein.

In an example, the computer environment 100 may include a host 110 providing a analyzer 105 accessed by a client 120. For purposes of illustration, the analyzer 105 may be a data processing service executing on a host 110 configured as a server computer with computer-readable storage 112. The analyzer 105 may include application programming interfaces (APIs) and related support infrastructure.

The client 120 may include any suitable computer or computing device 120a-e enabling a user 101 to access the host 110. Host 110 and client 120 are not limited to any particular type of devices. Although, it is noted that the operations described herein may be executed by program code 150 residing on the client (e.g., personal computer 120a), in some instances (e.g., where the client is a tablet 120b or mobile device 120c) the program code 150 may be better performed on a separate computer system having more processing capability, such as a server computer or plurality of server computers on a local area network for the client 120.

The computer environment 100 may also include a communication network 130, such as a local area network (LAN) and/or wide area network (WAN). Network 130 may also provide greater accessibility to the analyzer 105 for use in distributed environments, for example, where more than one user may have input and/or receive output from the analyzer 105.

Before continuing, it is noted that the computing devices are not limited in function. The computing devices may also provide other services in the computer environment 100. For example, host 110 may also provide transaction processing services and email services for the client 120.

The analyzer 105 may have access to at least one source 115 of information for the data center(s), including cross-platform data centers such as an internal or external cloud, used to provide a service. The source 115 may be part of the analyzer 105, and/or the source may be physically distributed in the network and operatively associated with the analyzer 105. The source 115 may include databases for providing historical information, and/or monitoring for providing real-time data. In an example, the source 115 may be shared between vendors, and/or may include proprietary data. There is no limit to the type or amount of information that may be provided by the source 115. In addition, the information may include unprocessed or "raw" data, or the content may undergo at least some level of processing.

In an example, the analyzer 105 described herein may be implemented as a system embodied as management tool(s), such as a so-called "dashboard" implemented by machine readable instructions (such as computer software) and output on an electronics device. The management tools enable a wide variety of users to evaluate service sustainability through a "bottom-up" approach using low-level device information for data center(s), including power consumption.

The management tools may be used by a service provider to assist in deploying a service so that the service satisfies sustainability goals (e.g., mandated by law, consumer demands, and/or provider benchmarks). Services may offer similar functionality on different platforms, and adjustments may be made based on given power consumption goals. For example, the user may compare deployment sites in terms of the ability of particular host(s) to provide more sustainable services.

Use of the management tools is not limited to a service provider. For example, the host may use the management tools to cap power consumption to meet sustainability goals, reduce costs, and/or meet regulator requirements. Consumers of the service may also use the management tools to compare the sustainability of different services.

As mentioned above, the program code 150 for providing these management tools may be executed by any suitable computing device to identify access patterns by the client 120 for content at a remote source. In addition, the program code may serve one or more than one client 120.

Figure 2:
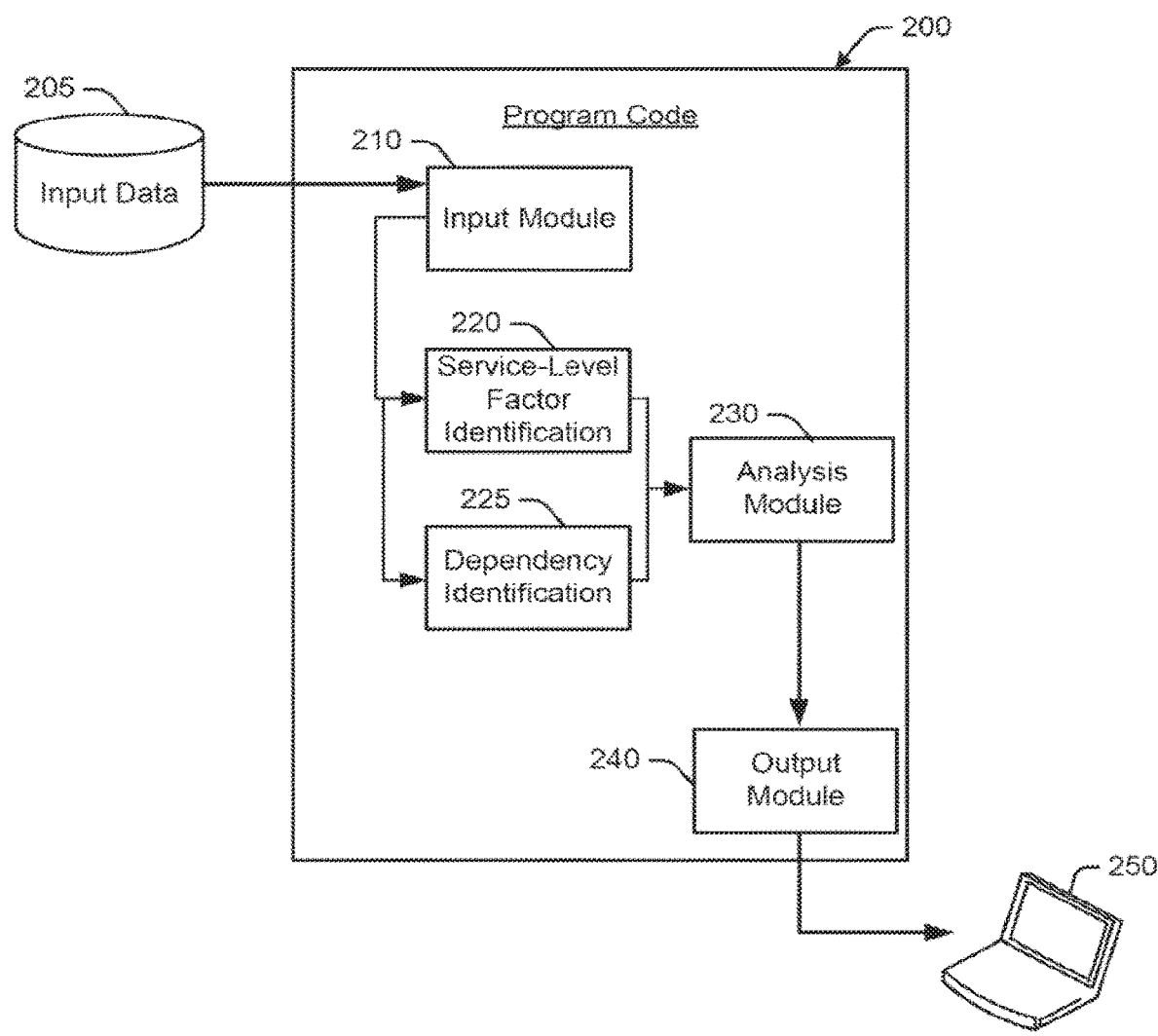
FIG. 2 shows an example architecture of machine readable instructions, which may be executed to quantify power usage for a service.

Program code used to implement features of the system can be better understood with reference to FIG. 2 and the following discussion of various example functions. However, the operations described herein are not limited to any specific implementation with any particular type of program code.

FIG. 2 shows an example architecture 200 of machine readable instructions, which may be executed to quantify power consumption. In an example, the program code 150 discussed above with reference to FIG. 1 may be implemented in machine-readable instructions (such as but not limited to, software or firmware). The machine-readable instructions may be stored on a non-transient computer readable medium and are executable by one or more processor to perform the operations described herein. It is noted, however, that the components shown in the drawings are provided only for purposes of illustration of an example operating environment, and are not intended to limit implementation to any particular system.

In an example, the program code executes the function of the architecture of machine readable instructions as self-contained modules. These modules can be integrated within a self-standing tool, or may be implemented as agents that run on top of an existing program code. In an example, the architecture of machine readable instructions may include an input module 210 to receive input data 205 (e.g., from source 115 in FIG. 1) for analysis. The input data 205 may include data corresponding to service-level factor(s) or metrics for the service in question.

Service sustainability may be defined in terms of various factors, such as cost, environmental impact, and social impact. By way of illustration, the cost may include the price of energy from computing, networking, storage, in addition to the price of facility equipment and support staff. The environmental impact may include energy, water and other natural resource consumption, and the resulting carbon footprint. The carbon footprint is the carbon equivalent emissions from the electricity generation.

The analysis executes as module 220 to identify service-level factors for a service, and module 225 to identify dependencies between the service-level factors. Analysis is facilitated by an analysis module 230, which generates power consumption information corresponding to the service-level factors and dependencies.

The methods identify interrelationships and dependencies of services. By way of illustration, services may be executing on a native Operating System (OS), or on a virtual machine. The services may be running alone or with other services hosted on the same machine. The services may also be dependent on a number of other services.

In an example, a suitable model is identified, and a dependency graph is generated to account for the dependencies. The models may be expressed in part by algorithms and formulae (described in more detail below), which can be implemented as methods to quantify power consumption for a service. Results of the analysis can be used to express power consumption and sustainability of individual services.

An output module 240 may output the results as power consumption and/or sustainability information for the service. The information may include service-level data based at least in part on analyzed impact information. By way of illustration, output may be to a display device, printing device or other user device (referred to generally as 250 in FIG. 2). The output may be in the format of a report, an email message, an alert or notification, and/or a combination of these or other formats.

Figure 3:
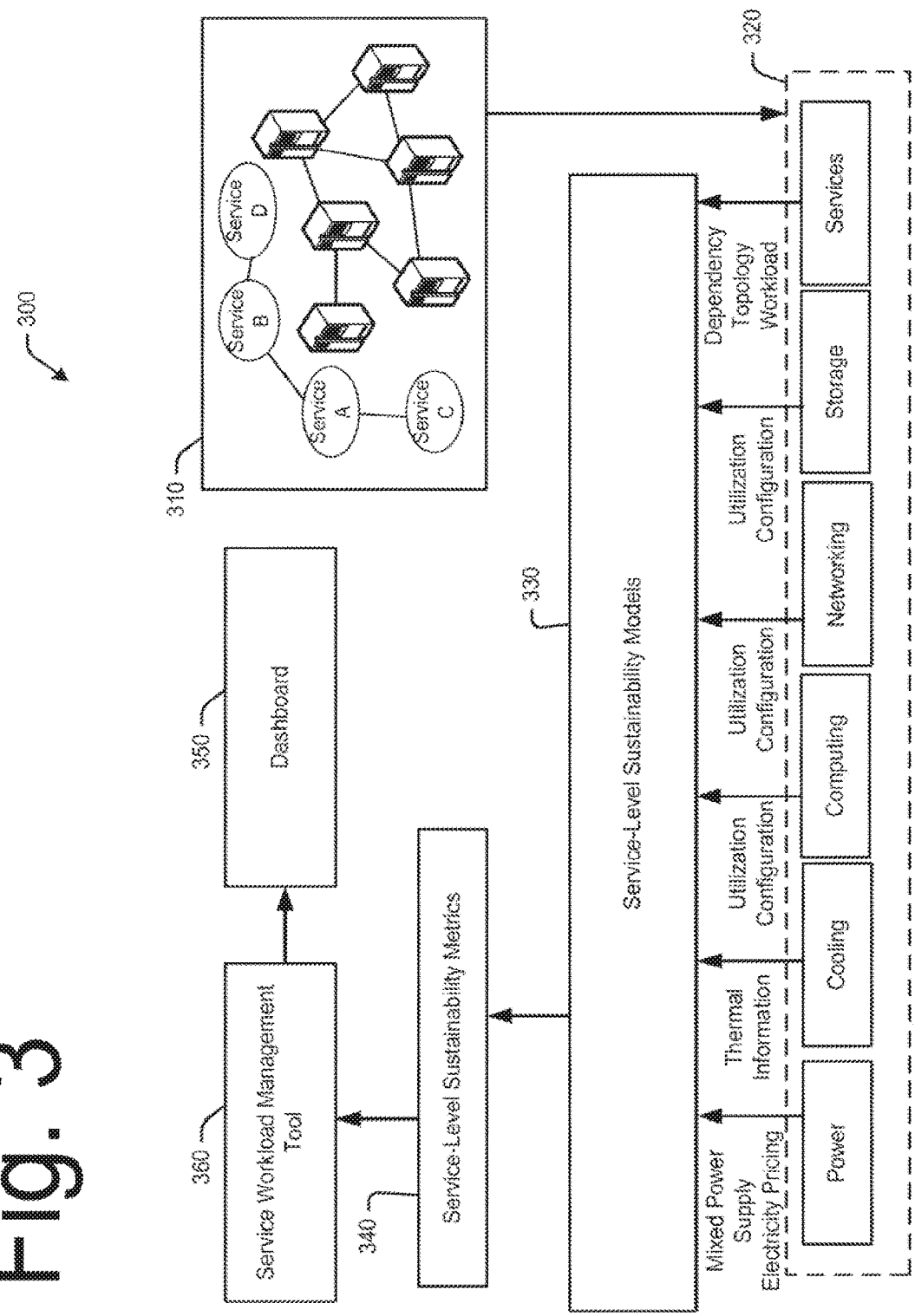
FIG. 3 illustrates an example processing environment for service sustainability modeling and evaluation.

An example implementation of the program code is illustrated with reference to FIG. 3. FIG. 3 illustrates an example processing environment 300 for modeling power consumption and evaluation for sustainability.

In the example processing environment 300, a cross-platform data center or cloud and various services it is used to provide infrastructure 310 is illustrated. It is noted that information for the data center and services 310 may be provided using any of a number of various techniques. For example, information for the data center and services 310 may be provided by vendor databases and/or by monitoring the data center (or components thereof) in real-time. Example types of information are illustrated by reference 320.

The analysis uses information for the data center 310. Models (described in more detail below) may be implemented in program code to describe the service in terms of sustainability metrics 340. Example sustainability metrics 340 include, but are not limited to, energy (power consumption), cost, carbon emissions, water, and other resources. The results may be output for a user, e.g., in dashboard 350 or by data center management systems (e.g., a service workload management tool).

FIG. 4 shows example output for a dashboard 400. The dashboard 400 may include information in terms of economic cost 410 for different services 405 and/or ecological cost 415, e.g., based on quantified power consumption. It is noted that the results may include any type of information and is not limited to the data shown in FIG. 4. In addition, the results may be interpreted by a user and/or submitted as input to additional processing components. To aid in this interpretation, the dashboard 400 may include indicators or alerts 420 and 425. The indicators may have a "green" or "yellow" or "red" appearance, where shading is used in FIG. 4 to indicate different colors. The lightest shading is yellow, the darkest shading is red, and the intermediate shading is green. The color green indicates an economic and/or ecological "friendly" service, yellow is borderline, and red is an economic and/or ecological "unfriendly" service. Other indicators may also be used, both visual and audible, to aid in interpreting quantified power consumption.

Results may be displayed in a report format (e.g., on a weekly, monthly, or quarterly basis) for management and/or to a customer for comparison with other service providers being considered for a project. Results may also be displayed in real-time so that adjustments can be made to meet pricing forecasts, sustainability goals and/or for regulatory purposes. Use of the results is not limited in any manner to a particular purpose.

To better understand the analysis and output, the following describes in more detail a model-based approach for generating the output. Before generating output, the analysis characterizes the service in question. The service can be characterized in a variety of different ways, as illustrated by the following example use cases. FIGS. 5a-e are high level illustrations of example use cases for different dependency models for a service. FIG. 6 is a process flow diagram 600 for determining impact factors for a service corresponding to the example use cases illustrated in FIGS. 5a-e.

Figure 5:
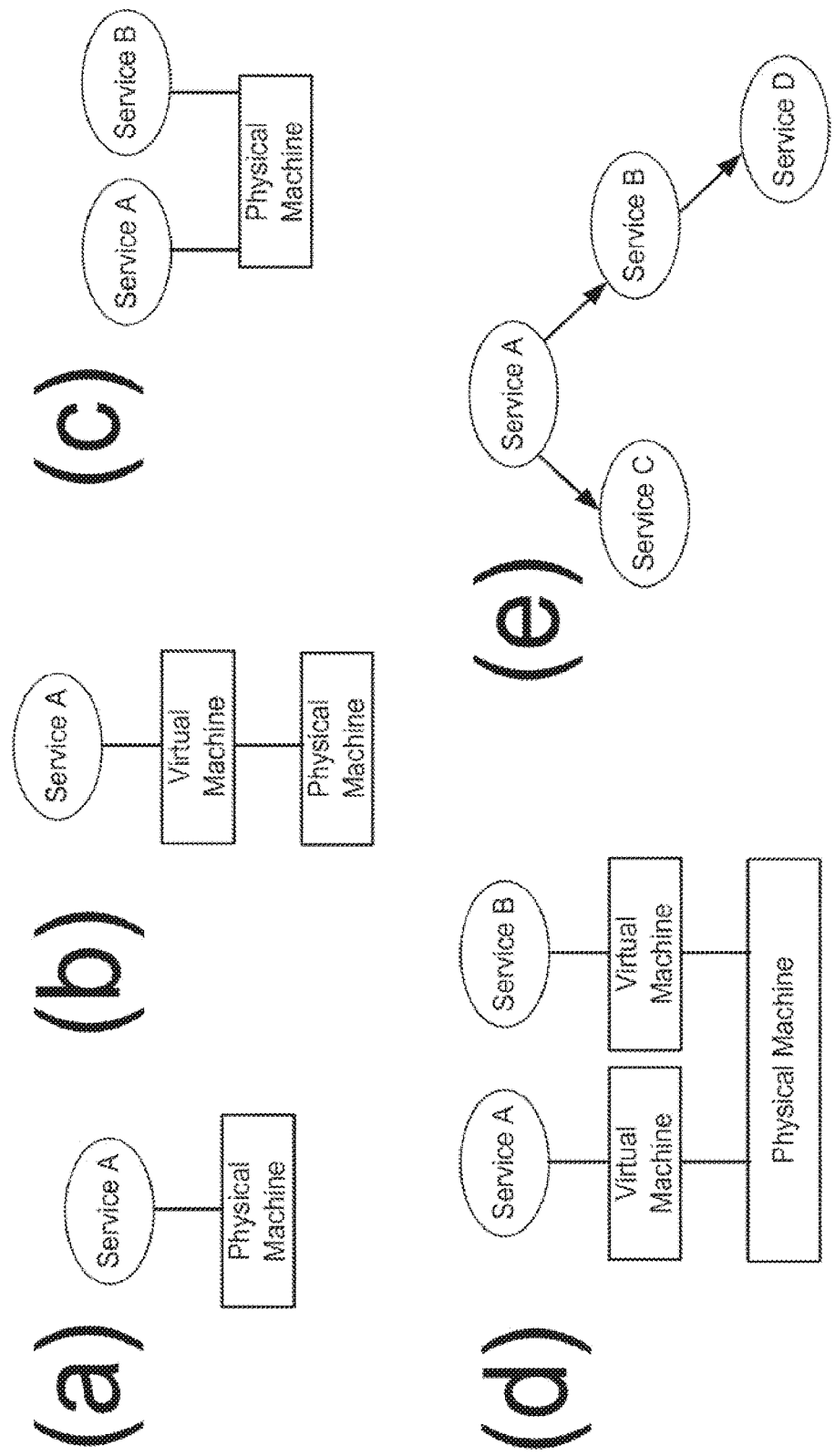
FIGS. 5a-e are high level illustrations of example use cases for different dependency models for a service.
Figure 6:
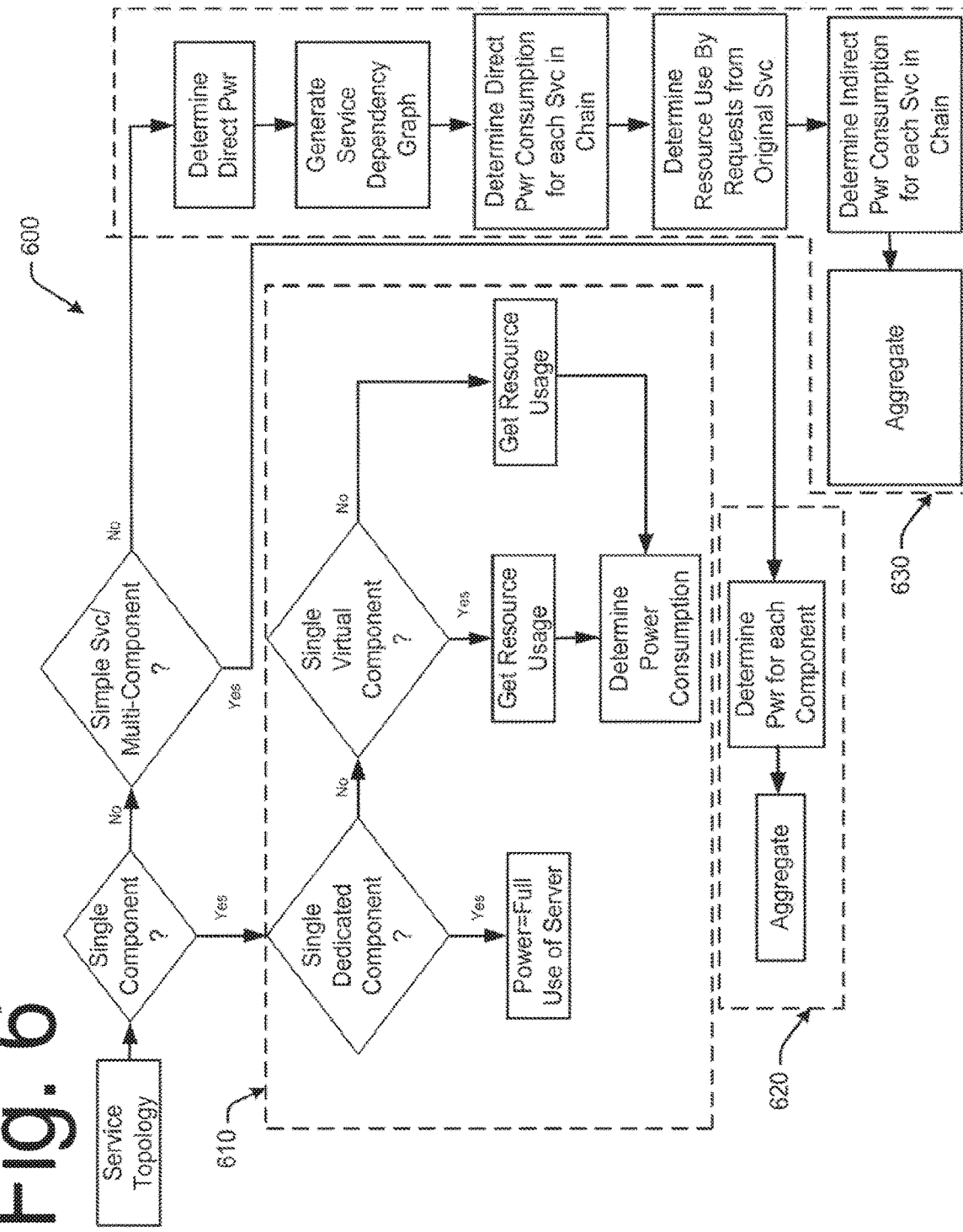
FIG. 6 is a process flow diagram for determining impact factors for a service corresponding to the example use cases illustrated in FIGS. 3a-e.

An example use case of a single component on a dedicated physical server is illustrated in FIG. 5a, and corresponds to the process flow 610 shown in FIG. 6. Here, a service may use a single component, such as, a dedicated physical server. In this example use case, power consumption $P_i$ of the service can be defined as the full power usage of the physical server $P_s$ used to provide the service.

$$P_i = P_s \qquad \text{EQN (1)}$$

An example use case of a single virtualized component is illustrated in FIG. 5b, and corresponds to the process flow 610 shown in FIG. 6. Here, a service may have a single component running inside a virtual machine, and the virtual machine may share a physical server with other services and virtual machines.

It may not be possible to directly measure the power consumption of a virtual machine. Instead, a model may be used to apportion physical server power consumption to the virtual machine. Power consumption of a physical server can be separated into two parts. One part is the idle power (e.g., power usage when the server is idle), which can be determined based on the configuration (e.g., processor model, number of processors and speed, memory type and size, network interface cards, and power supply). Another part is dynamic power, which can be determined based on resource activity levels, (e.g., CPU utilization).

The model may be used to apportion the dynamic power to virtual machines based on resource usage. Though dynamic power can be affected by other resources, the CPU is often the main contributor to the dynamic power. Other non-CPU resource activities either have a very small dynamic range (e.g., memory), or correlate well with the CPU activity. For example, I/O processing correlates well with CPU activity.

Using CPU utilization as the main signal of resource activity has been shown to work well in practice. Thus, the model can account for both direct and indirect CPU usage by a virtual machine. The latter is mainly the CPU consumed for I/O processing by the management domain on behalf of the virtual machine. This is generally not reported as CPU usage for the virtual machine. It has been shown that the indirect CPU overhead for an I/O intensive application can reach 20%-45%. While the direct CPU usage can be obtained for a virtual machine from monitoring data, the virtual machine's CPU consumption may also be estimated based on the contribution of I/O processing, using the percentage of packets sent/received by the virtual machine. The actual CPU usage charged to a virtual machine can be estimated using the following Equation (2).

$$u_i = \bar{u}_i + \frac{n_i}{n} u_0 \qquad \text{EQN (2)}$$

In Equation (2), the CPU usage directly by a virtual machine, $u_0$ is the CPU utilization of the management domain. Also in Equation (2), n is the number of total packets processed by the physical server, and $n_i$ is the number of packets contributed by the virtual machine.

Accordingly, power usage can be measured and divided as dynamic power usage across the virtual machines proportionally, based on overall CPU utilization.

It is noted that the memory access makes a small contribution to the dynamic power, but can be a significant contributor to idle power. Accordingly, a physical server idle power consumption is proportionally allocated to a virtual machine based on CPU usage and allocated memory sizes. In an example, a virtual machine's power consumption can be calculated using Equation (3).

$$P_i = (P_s - P_{idle}) * u_i + (P_{idle} - P_{memory}) * \frac{u_i}{\sum_{j \in J} u_j} + P_{memory} * \frac{M_i}{\sum_{j \in J} M_j} \quad \text{EQN (3)}$$

In Equation (3), J is the set of virtual machines running on the server, $u_i$ is the CPU usage of a virtual machine i, $M_i$ is the amount of memory allocated to the virtual machine, $P_s$ is the actual power consumption of the physical server, the idle power of a physical server, and $P_{memory}$ is the portion of idle power contributed by the memory. Idle physical power and memory power consumption values can be determined based on the server specification or management tools, such as a benchmark application or database.

An example use case of a single non-virtualized component sharing resources with other services is illustrated in FIG. 5c, and corresponds to the process flow 610 shown in FIG. 6. Here, a service has a single non-virtualized component that shares a physical server with components of other services. In this case, resource usage information for the service may be obtained by estimating the resource usage of a non-virtualized component using a resource usage model.

There are typically a number of transaction types in a service. For example, an online e-business application has transaction types such as login, browse, checkout, etc. In many cases, different transaction types have different resource demands, but the resource demand of a single transaction type is relatively similar, because each transaction type usually has a relatively fixed code execution path. During a certain interval, a component's resource usage is the sum of the demand of all transaction types. Hence, the resource consumption of a service component can be determined using a linear function of the transaction mix, for example, according to Equation (4).

$$u_i = \sum_{n=1}^{N} \alpha_n \lambda_n \quad \text{EQN (4)}$$

In Equation (4), N is number of unique transaction types, $\lambda_n$ (n=1 . . . N) is the request rate of transaction type n during a time interval, and $\alpha_n$ is the resource usage of transaction type n (e.g., per-transaction-type resource usage).

Statistics for different transaction types or user requests are readily available from regular application monitoring. The model parameters $\alpha_n$ can be identified using linear regression over multiple measurement intervals. The resource model has been evaluated and shown to be accurate.

After a resource usage for the service components is determined, the power model shown in Equation (3) can be used to apportion the physical server power consumption to the component, as already described above for the use case shown in FIG. 5b. It is noted that in this example use case, J is the set of service components running on the server.

An example use case of a simple service with multiple components is illustrated in FIG. 5d, and corresponds to the process flow 620 shown in FIG. 6. Here, a service has multiple components across multiple physical servers. These components can be either virtualized, or non-virtualized, and can use dedicated physical servers, or share resources with components of other services. To estimate the power consumption of such a service, the configuration and topology information of the service can be extracted to discover which components belong to the service, and which physical server(s) the service is executing on.

For a component that runs on a dedicated server, the power consumption is the full power usage of the physical server and can be obtained directly. For a non-virtualized component (one that shares resources with other services), the resource usage model can be used to estimate resource usage. See Equation 4, as already described above for the use case shown in FIG. 5c.

The virtual machine resource usage model (Equation 2) may be used to calculate usage of a virtualized component. After obtaining the resource usage for each component (virtualized or non-virtualized, dedicated or non-dedicated), the power model (Equation 3) can be used to obtain the component level power consumption. Finally, the component level power consumption can be aggregated to obtain the service's power consumption, as shown by Equation (5).

$$P = \sum_{i=1}^{M} P_i \quad \text{EQN (5)}$$

In equation (5), M is the number of service components, and $P_i$ is the power usage of service component i.

An example use case of a complex service is illustrated in FIG. 5e, and corresponds to the process flow 630 shown in FIG. 6. A complex service relies on other services to process requests from clients. In general, when an incoming request arrives, a service performs some processing by itself, and then passes or generates one or multiple requests to other services, which may also send requests to additional services, and so on. The replies may be sent back in reverse order. When a service receives replies from other services, the service processes the replies (e.g., by aggregating), and sends the results back to the requesting service. The results are processed by the first service that the client directly interacts with, and a final reply is sent back by the first service to the client. Such as service dependency can be modeled as a direct acyclic graph (DAG), where each note represents a service and the edge indicates the service dependency relationship.

When the service in question has been characterized, the analysis may determine power use. Power use may include both direct and indirect power use. In an example, the direct power usage by a service itself is considered due to local processing and indirect power usage from other services that process requests originating from the service. The local processing falls into one of the use cases described above with reference to FIGS. 5a-e. Therefore, one of the methods or models described above can also be used to determine the direct power consumption.

To determine indirect power consumption, the service dependency information is obtained, and a DAG is generated. For each service on the service chain (except the original service), the power usage is calculated which was contributed by those requests from the original service (directly or indirectly). Similar to the use case shown in FIG. 5c, the resource usage of requests is estimated using the resource usage model, e.g., as expressed by Equation (4). Then the direct power usage of a service is proportionally allocated to the requests from other services to obtain indirect power usage.

All power usage charged to sub-requests handled by other services is aggregated to obtain the indirect power consumption of the service, as shown by Equation (6).

$$P_{indirect} = \sum_{k=1}^{K} \frac{\dot{u}_k}{u_k} P_k^{indirect}$$
EQN (6)

In Equation (6), K is the number of services on the service chain (e.g., the number of services or sub-requests that the original service relies on), and $\dot{u}_K$ is the portion of resource usage of service K that is contributed by requests from the original service. Also in Equation (6), $u_K$ is the total resource usage of service K, and $p_K^{direct}$ is the direct power usage of service K.

After determining the power consumption of a service, the sustainability impact may be determined. The impact on service-level sustainability (e.g., carbon emission, resource consumption) may depend at least in part on the efficiency of the infrastructure. For example, water and electricity consumption may depend on the cooling and power infrastructure of the data center. In some examples, the sustainability impact may be highly dependent on these efficiencies (or lack thereof).

In an example, power consumption efficiencies may be indicated by the power usage efficiency (PUE) metric. A PUE of 1.5 indicates that for each Watt used by data center equipment, an additional half Watt is used for cooling, power distribution, etc. Thus, using the data center PUE, the total power demand $P_{total}$ for a service can be determined by multiplying the power demand P for hosting the service with the data center PUE according to Equation (7).

$$P_{total} = P * PUE$$
EQN (7)

Carbon emissions can be determined based on the power supply mix for the data center. In an example, the amount of carbon emission per KWh are determined for each power supply source. The carbon emission per KWh for the power supply mix can be expressed as a weighted average over all power supply sources for the data center, as expressed by Equation (8).

$$CO2\_Per\_KWh_{SupplyMix} = \Sigma_{q \in Q} \gamma_q * CO2\_Per\_KWh_q$$
EQN (8)

In Equation (8), Q is the set of power supply sources, $CO2\_Per\_KWh_{SupplyMix}$ is the amount of carbon emissions for each KWh from supply q, and $\gamma_q$ is the fraction of power from source, with the summation equal to 1. Accordingly, carbon emissions for the service may be expressed by Equation (9).

$$CO2 = P_{total} * CO2\_Per\_KWh_{SupplyMix}$$
EQN (9)

It is noted that if the power mix of the data center or the carbon emissions for the various power sources is unknown, then average numbers for the carbon emissions of power sources (e.g., for the corresponding region/country) may be used instead.

The water consumption of a service may include both direct and indirect natural resource consumption. For example, direct water consumption is the water loss at the cooling towers of the data center, and depends at least to some extent on the cooling infrastructure and the amount of cooling needed (e.g., measured in tons of cooling). The equations and parameters used to determine direct water consumption depend on the cooling solution implemented.

Indirect water consumption is based on the water consumption at the power generation plant. The average water consumption per KWh for the power supply mix of the data center can be determined with an expression such as Equation (8), and then used to determine the indirect water consumption of the service, similar to the determination based on Equation (9), above.

Having described example implementations of a system to quantify power consumption, it is noted that features may also include providing a user (consumer and/or service provider) with sustainability-awareness, the ability to perform adjustments for improving power consumption, and develop pricing models that account for other impacts (e.g., environmental impact).

Before continuing, it should be noted that the examples described above are provided for purposes of illustration, and are not intended to be limiting. Other devices and/or device configurations may be utilized to carry out the operations described herein.

Figure 7:
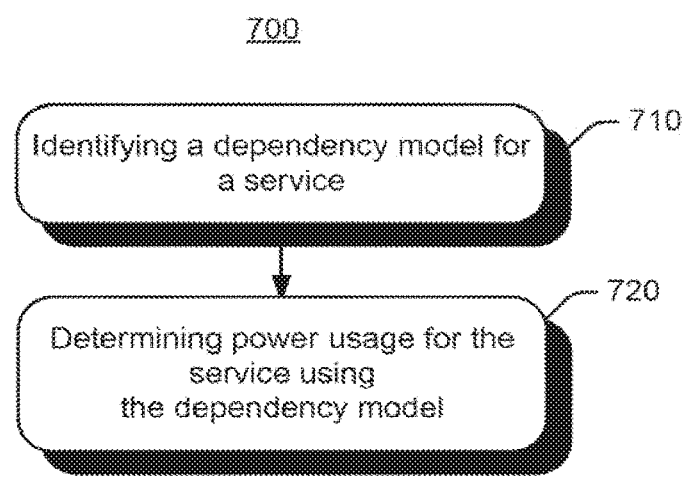
FIG. 7 is a flowchart illustrating example operations which may be implemented to quantify power usage for a service.

FIG. 7 is a flowchart illustrating example operations which may be implemented to quantify power consumption. Operations 700 may be embodied as logic instructions on one or more computer-readable media. When executed on a processor, the logic instructions cause a general purpose computing device to be programmed as a special-purpose machine that implements the described operations. In an example, the components and connections depicted in the figures may be used.

Operation 710 includes identifying a dependency model for the service, the dependency model based in part on infrastructure providing the service. Operation 720 includes determining power usage for the service using the dependency model. Determining power usage may include calculating a direct power consumption component and/or an indirect power consumption component for the service. Determining power consumption may also be for virtualized infrastructure and/or for non-virtualized infrastructure.

The operations shown and described herein are provided to illustrate example implementations. It is noted that the operations are not limited to the ordering shown. Still other operations may also be implemented.

Still further operations may include apportioning total power consumption among the infrastructure providing the service according to the dependency model. Operations may also include extracting configuration and topology information for the infrastructure. Operations may also include discovering components in the infrastructure which belong to the service. Further operations may include aggregating component level power consumption to determine power usage by the service.

The operations may be implemented at least in part using an end-user interface (e.g., web-based interface). In an example, the end-user is able to make predetermined selections, and the operations described above are implemented on a back-end device to present results to a user. The user can then make further selections. It is also noted that various of the operations described herein may be automated or partially automated.

It is noted that the examples shown and described are provided for purposes of illustration and are not intended to be limiting. Still other examples are also contemplated.

The invention claimed is:

1. A method, comprising:
identifying, from a plurality of dependency models, a dependency model for each service of a plurality of different services in relation to an infrastructure providing the service, wherein at least one of the dependency models is for a sole service implemented on virtualized infrastructure having underlying non-virtualized infrastructure, the plurality of dependency models to apportion power consumption by the non-virtualized infrastructure to the plurality of different services based on an idle power consumption based on a configuration of the non-virtualized infrastructure and based on a dynamic power consumption based on resource activity levels;

responsive to identifying the dependency model, determining power usage of the service using the identified dependency model based on a ratio of processor usage attributed to the virtualized infrastructure to processor usage attributed to other virtualized infrastructure, if any, having the underlying non-virtualized infrastructure;

determining a sustainability impact based on the determined power usage;

selecting the service based on the sustainability impact; and using the selected service.

2. The method of claim 1, further comprising, apportioning total power consumption among the infrastructure providing the service according to the dependency model.

3. The method of claim 1, further comprising, extracting configuration and topology information for the infrastructure.

4. The method of claim 1, further comprising, discovering components in the infrastructure which belong to the service.

5. The method of claim 1, wherein determining the power usage includes determining a direct power consumption component of the service.

6. The method of claim 1, wherein determining the power usage includes determining an indirect power consumption component of the service.

7. The method of claim 1, wherein the plurality of different services includes a service having virtualized infrastructure.

8. The method of claim 1, wherein the plurality of different services includes a service having non-virtualized infrastructure.

9. The method of claim 1, further comprising aggregating component level power consumption to determine power usage of the service.

10. The method of claim 1, wherein at least one of the dependency models is for a sole service implemented on non-virtualized infrastructure.

11. The method of claim 1, wherein the method further comprises responsive to the identified dependency model being for a service implemented on non-virtualized infrastructure, determining the power usage of the service based on processor usage attributed to the service based on a linear function of unique transaction types that the service processes and resource usage of each transaction type.

12. The method of claim 1, wherein the method further comprises responsive to the identified dependency model being for a service of a plurality of services each implemented on separate virtualized infrastructure having a same underlying non-virtualized infrastructure, determining the power usage based on a sum of power usage of each service component of a plurality of service components of the service, and wherein the power usage of each service component is based on a ratio of processor usage attributed to the service component to processor usage attributed to other of the service components multiplied by a difference between idle power of the non-virtualized infrastructure and idle power contributed by memory of the non-virtualized infrastructure.

13. The method of claim 1, wherein the method further comprises responsive to the identified dependency model being for a service implemented on a hierarchy of underlying services determining the power usage of the service based on an indirect power consumption of the service, and wherein the indirect power consumption being based on a sum of a ratio of resource usage of each underlying service to resource usage of the service multiplied by direct power usage of the service.

14. The method of claim 1, wherein at least one of the plurality of different services is independent of a different one of the plurality of services for processing requests from clients.

15. The method of claim 1, wherein determining the power usage of the service is based on the processor usage attributed to the virtualized infrastructure multiplied by a difference between actual power consumption of the underlying non-virtualized infrastructure and the idle power of the non-virtualized infrastructure.

16. A non-transient computer-readable medium storing machine readable instructions comprising instructions executable to cause a processor to:

for each service of a plurality of different services each having an infrastructure providing the service:

identify, from a plurality of dependency models, a dependency model for the service in relation to the infrastructure providing the service, wherein at least one of the dependency models is for a service of a plurality of services implemented on non-virtualized infrastructure, the plurality of dependency models to apportion power consumption by the non-virtualized infrastructure to the plurality of different services based on an idle power consumption based on a configuration of the non-virtualized infrastructure and based on a dynamic power consumption based on resource activity levels;

responsive to identifying the dependency model, determine power usage for the service using the identified dependency model based on processor usage attributed to the service, based on a linear function of unique transaction types that the service processes and resource usage of each transaction type;

determine a sustainability impact based on the determined power usage;

select the service based on the sustainability impact; and use the selected service.

17. The medium of claim 16, wherein the machine readable instructions further comprise instructions executable to cause the processor to characterize the service.

18. The medium of claim 16, wherein the dependency model is a direct acyclic graph (DAG).

19. The medium of claim 16, wherein the machine readable instructions further comprise instructions executable to cause the processor to charge power usage to sub-requests handled by other services to obtain indirect power consumption.

20. The medium of claim 16, wherein at least one of the plurality of different services relies on a different one of the plurality of services to process requests from clients.

* * * * *